US012751108B2

(12) United States Patent
Jeong et al.

(10) Patent No.: US 12,751,108 B2
(45) Date of Patent: Sep. 29, 2026

(54) CIGS SOLAR CELL WITH BOTH TRANSPARENCY AND FLEXIBILITY AND ITS MANUFACTURING METHOD

(71) Applicant: KOREA INSTITUTE OF SCIENCE AND TECHNOLOGY, Seoul (KR)

(72) Inventors: Jeung-Hyun Jeong, Seoul (KR); Won Mok Kim, Seoul (KR); Gee Yeong Kim, Seoul (KR); Seonghoon Jeong, Seoul (KR); Jun Hwan Choi, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 18/984,274

(22) Filed: Dec. 17, 2024

(65) Prior Publication Data

US 2026/0006938 A1 Jan. 1, 2026

(30) Foreign Application Priority Data

Jun. 28, 2024 (KR) ........................ 10-2024-0085435

(51) Int. Cl.
*H10F 71/00* (2025.01)
*H10F 10/12* (2025.01)
(Continued)

(52) U.S. Cl.
CPC ....... *H10F 71/134* (2025.01); *H10F 71/1385* (2025.01); *H10F 71/139* (2025.01);
(Continued)

(58) Field of Classification Search
CPC ....... H10F 77/126–1265; H10F 77/134; H10F 77/139–1395
See application file for complete search history.

(56) References Cited

U.S. PATENT DOCUMENTS 8,075,723 B1 12/2011 Farris, III
9,941,423 B2 * 4/2018 Jeong ...................... H10F 19/33
(Continued)

FOREIGN PATENT DOCUMENTS

JP 2016-178191 A 10/2016
JP 6411258 B2 10/2018
(Continued)

OTHER PUBLICATIONS

Fabrication of flexible and bifacial Cu(In, Ga)Se2 solar cell with superstrate-type structure using a lift-off process; Hamada et al.; Mar. 15, 2020; DOI: https://doi.org/10.1016/j.solener.2020.02.084. (Year: 2020).*

(Continued)

*Primary Examiner* — Christine S. Kim
*Assistant Examiner* — Tyler J Wiegand
(74) *Attorney, Agent, or Firm* — NSIP Law

(57) ABSTRACT

The present invention relates to a CIGS solar cell having both transparency and flexibility and a method of manufacturing the same. The method of manufacturing a CIGS solar cell having both transparency and flexibility according to the present invention is characterized by including the steps of: preparing a carrier substrate on which a transparent polymer film is stacked; sequentially stacking a rear transparent electrode, a CIGS light-absorbing layer, and a front transparent electrode on the transparent polymer film; irradiating a long-wavelength laser to an interface between the rear transparent electrode and the CIGS light-absorbing layer in some areas to remove the CIGS light-absorbing layer and the front transparent electrode, thereby forming a light-transmitting region that exposes the rear transparent electrode; and irradiating a short-wavelength laser to an interface between the carrier substrate and the transparent (Continued)

polymer film to separate the carrier substrate and the transparent polymer film from each other.

11 Claims, 14 Drawing Sheets

(51) Int. Cl.

| | |
|---|---|
| ***H10F 19/33*** | (2025.01) |
| ***H10F 77/12*** | (2025.01) |
| ***H10F 77/20*** | (2025.01) |

(52) U.S. Cl.

CPC ....... *H10F 71/1395* (2025.01); *H10F 77/211* (2025.01); *H10F 10/12* (2025.01); *H10F 19/33* (2025.01); *H10F 77/126* (2025.01)

(56) References Cited

U.S. PATENT DOCUMENTS

| | | | | |
|---|---|---|---|---|
| 2013/0240039 | A1 | 9/2013 | Park | |
| 2021/0135029 | A1 * | 5/2021 | Yu | H10F 71/1385 |

FOREIGN PATENT DOCUMENTS

| | | | | | |
|---|---|---|---|---|---|
| KR | 10-2012-0059361 | A | | 6/2012 | |
| KR | 10-2014-0126794 | A | | 11/2014 | |
| KR | 10-1653282 | B1 | | 9/2016 | |
| KR | 10-1688401 | B1 | | 12/2016 | |
| KR | 10-2017-0093005 | A | | 8/2017 | |
| KR | 10-2019-0080215 | A | | 7/2019 | |
| KR | 10-2020-0080768 | A | | 7/2020 | |
| KR | 20200080768 | A | * | 7/2020 | H10F 71/00 |
| KR | 10-2022-0031810 | A | | 3/2022 | |
| KR | 10-2023-0050236 | A | | 4/2023 | |
| KR | 10-2023-0082211 | A | | 6/2023 | |
| KR | 10-2024-0097264 | A | | 6/2024 | |

OTHER PUBLICATIONS

Enhanced Mechanical Stability of CIGS Solar Module with Glass/Polyimide/Indium Tin Oxide for Potentially Flexible Applications; Jeong et al.; Mar. 23, 2023; DOI: https://doi.org/10.1021/acsaem.2c03957 (Year: 2023).*

CIGS thin film solar cells on polyimide foils; Nakada et al.; Nov. 1, 2010; DOI: 10.1109/PVSC.2010.5615947 (Year: 2010).*

Transparent back-junction control in Cu(In, Ga)Se2 absorber for high-efficiency, color-neutral, and semitransparent solar module; Jeong et al.; Dec. 15, 2021; DOI: https://doi.org/10.1002/pip.3520 (Year: 2021).*

Korean Office Action issued on Sep. 5, 2025, in counterpart Korean Patent Application No. 10-2024-0085435 (7 pages in English, 7 pages in Korean).

Korean Notice of Allowance issued on May 8, 2026, in counterpart Korean Patent Application No. 10-2024-0085435 (2 pages in English, 1 pages in Korean).

* cited by examiner

| | Glass/coated PI | Transmission image of PI sample | Close-up of PI sample |
|---|---|---|---|
| Step2: 2000 rpm<br><br>PI thickness: 6.7 um |  |  |  |
| Step2: 6000 rpm<br><br>PI thickness: 2.5 um |  |  |  |

CIGS SOLAR CELL WITH BOTH TRANSPARENCY AND FLEXIBILITY AND ITS MANUFACTURING METHOD

DESCRIPTION OF GOVERNMENT-SPONSORED RESEARCH AND DEVELOPMENT

This study was conducted with the support of the Ministry of Science and ICT and the National Research Foundation of Korea [Research project name: Climate change response technology development; Research task name: Source technology of high-efficiency light-transmitting solar cell module based on CIGS thin-film solar cell; Task identification number: 1055001324; and Task number: 2019M1A2A2072412].

CROSS REFERENCE TO RELATED APPLICATION

The present application claims priority to Korean Patent Application No. 10-2024-0085435, filed on Jun. 28, 2024, the entire contents of which is incorporated herein for all purposes by this reference.

BACKGROUND OF THE INVENTION

Field of the Invention

The present invention relates to a CIGS solar cell having both transparency and flexibility and a method of manufacturing the same.

In addition, this study was conducted with the support of the Ministry of Science and ICT and the National Research Foundation of Korea [Research project name: Development of step-up carbon neutral technology; Research task name: Development of high-efficiency, large-area, ultralight, flexible and non-toxic CIGS thin-film solar cell technology; Task identification number: 1055001268; and Task number: 2022M3J1A1063019].

Description of the Related Art

A window-type solar cell module is a technology that replaces building windows with solar cell modules, and is one of the main technologies of building integrated photovoltaics (BIPV). Recently, research has been actively conducted on the development of the window-type solar cells modules using thin film solar cells. The development of the window-type solar cell modules based on amorphous silicon solar cells, dye-sensitized solar cells, organic solar cells, and CIGS solar cells is representative.

The basic characteristics required for the window-type solar cell modules are transparency in addition to excellent photoelectric conversion efficiency. Accordingly, most of the window-type solar cell modules described above have a structure in which solar cells are stacked on a glass substrate to secure transparency.

Meanwhile, if the window-type solar cell modules secure not only transparency but also flexibility, they will be applicable in the form of attaching the window-type solar cell modules to existing windows, i.e., glass windows, and their application potential in buildings will be expanded, such as making it easier to avoid building regulations.

An organic solar cell (OPV) can be cited as the thin film solar cell that can secure both transparency and flexibility. However, carbon-based organic materials used as light-absorbing layers in the organic solar cells have the characteristic of easily deteriorating compared to inorganic materials such as CIGS, making it difficult to use them for long-term photovoltaic power generation.

In the case of CIGS solar cells that use $Cu(In_{1-x}Ga_x)(Se_{1-y}S_y)$-based compounds as light-absorbing layers, the light absorption characteristics are excellent, but there are process difficulties in securing transparency and flexibility at the same time due to the fact that CIGS is an opaque material, and the process limit temperature of flexible materials.

In order to secure flexibility and transparency, it may be considered to apply polyimide or metal foil as a substrate instead of a glass substrate. However, if the metal foil is used as a substrate, flexibility can be secured, but it is difficult to secure transparency because the metal foil itself is opaque.

When the CIGS solar cell is implemented on the polyimide substrate, it can be expected that a transparent and flexible CIGS solar cell can be implemented based on the flexibility and transparency of the polyimide. However, since the deposition temperature of the CIGS light-absorbing layer (above 500° C.) overlaps with the deterioration temperature of the polyimide, and the CIGS is an opaque material, it is difficult to implement a CIGS solar cell that simultaneously secures transparency and flexibility even if the polyimide substrate is applied.

Korean Laid-Open Patent Publication No. 2012-0059361proposes a technology for providing flexibility to a CIGS solar cell by stacking a separation layer on a sacrificial substrate, stacking a CIGS solar cell structure including a second electrode on the separation layer, separating the sacrificial substrate and the separation layer from the CIGS solar cell structure, and then stacking a flexible substrate on the second electrode, but does not propose a technology for ensuring transparency.

In addition, Korean Registered Patent Publication No. 1653282 discloses a technology for reducing the effective thermal expansion coefficient of polyimide by providing a thermal expansion-suppressing layer (TiAIN, etc.) on at least one of both sides of a polyimide substrate, thereby suppressing cracking and peeling of solar cells, but also fails to mention a technology for securing transparency.

Japanese Patent Publication No. 6411258 discloses a technology of stacking a CIGS solar cell structure on a sacrificial layer ($MoSe_2$), removing the sacrificial layer and glass substrate using an etchant, and then stacking a conductive flexible layer (substrate) on the CIGS, as in Korean Laid-Open Patent Publication No. 2012-0059361 using a sacrificial layer, but fails to describe a technology for ensuring transparency in addition to flexibility.

SUMMARY OF THE INVENTION

Technical Problem

The present invention has been devised to solve the above problems, and an object of the present invention is to provide a CIGS solar cell having both transparency and flexibility and a method of manufacturing the same.

Technical Solution

In order to achieve the above-mentioned object, the method of manufacturing a CIGS solar cell having both transparency and flexibility according to the present invention is characterized by including the steps of: preparing a carrier substrate on which a transparent polymer film is stacked; sequentially stacking a rear transparent electrode, a CIGS light-absorbing layer, and a front transparent electrode on the transparent polymer film; irradiating a long-wavelength laser to an interface between the rear transparent electrode and the CIGS light-absorbing layer in some areas to remove the CIGS light-absorbing layer and the front transparent electrode, thereby forming a light-transmitting region (T) exposing the rear transparent electrode; and irradiating a short-wavelength laser to an interface between the carrier substrate and the transparent polymer film to separate the carrier substrate and the transparent polymer film from each other.

The short-wavelength laser may be transmitted through the carrier substrate and absorbed in the transparent polymer film.

The long-wavelength laser may be transmitted through the carrier substrate, the transparent polymer film, and the rear transparent electrode and absorbed in the CIGS light-absorbing layer.

The wavelength of the long-wavelength laser may be 500 nm or more, preferably 750 nm or more. In addition, the wavelength of the short-wavelength laser may be greater than or equal to a wavelength corresponding to the bandgap of the carrier substrate and equal to or less than 380 nm.

The transparent polymer film may have transparency and flexibility.

The transparent polymer film may be made of polyimide.

The carrier substrate may be a glass substrate.

The rear transparent electrode may be formed of a single layer of a transparent conductive oxide (TCO).

The rear transparent electrode may have a double-layer structure in which transparent conductive oxide (TCO) and conductive metal are sequentially stacked.

The transparent conductive oxide (TCO) may be any one selected from indium oxide ($In_2O_3$) doped with one or more metals selected from tin (Sn), molybdenum (Mo), tungsten (W), and titanium (Ti); tin oxide ($SnO_2$) doped with fluorine (F) or antimony (Sb); zinc oxide (ZnO) doped with one or more elements selected from elements consisting of aluminum (Al), gallium (Ga), indium (In), boron (B), fluorine (F), and hydrogen (H); a mixed oxide of indium oxide and zinc oxide (IZO); or a mixed oxide of zinc oxide and tin oxide (ZTO).

The conductive metal may be any one of molybdenum (Mo), silver (Ag), gold (Au), platinum (Pt), aluminum (Al), and copper (Cu), or an alloy thereof.

The thickness of the transparent polymer film may be 3 μm or less.

The method may further include a step of stacking a transparent encapsulation layer on the entire surface including the light-transmitting region (T) in a state in which the light-transmitting region (T) is formed, before proceeding with the step of separating the carrier substrate and the transparent polymer film from each other.

A CIGS solar cell having both transparency and flexibility according to the present invention is characterized by comprising: a rear transparent electrode stacked on a transparent polymer film; a CIGS light-absorbing layer stacked on the rear transparent electrode; and a front transparent electrode stacked on the CIGS light-absorbing layer, wherein the CIGS light-absorbing layer and the front transparent electrode in some areas are removed to provide a light-transmitting region (T) exposing the rear transparent electrode.

It may have a P1 scribing region for isolating adjacent cells by insulating the rear transparent electrode; a P2 scribing region for connecting the rear transparent electrode of one cell to the front transparent electrode of an adjacent cell by etching the absorber layer; and a P3 scribing region for isolating adjacent cells by insulating the front transparent electrode.

Advantageous Effects

The CIGS solar cell having both transparency and flexibility according to the present invention and its manufacturing method have the following effects.

Since both transparency and flexibility are secured in implementing the CIGS solar cell, the applicability of the CIGS solar cell is expanded. In addition, since the thin film stacking process is performed in a state in which the transparent polymer film is stacked on the carrier substrate, the bending deformation and thermal expansion of the transparent polymer film can be suppressed. Furthermore, since the carrier substrate and the transparent polymer film are separated from each other by irradiating a long-wavelength laser to the interface between the carrier substrate and the transparent polymer film, the manufacturing process can be simplified.

DETAILED DESCRIPTION OF THE INVENTION

Figure 1:
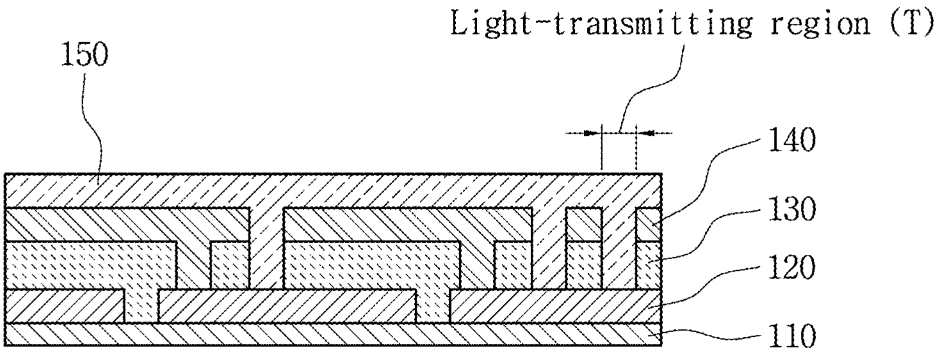
FIG. 1 is a diagram showing the configuration of a CIGS solar cell having both transparency and flexibility according to one embodiment of the present invention.

The present invention proposes a CIGS solar cell having both transparency and flexibility.

In order to secure the flexibility of CIGS solar cells, conventional technologies apply a separation layer (see Korean Laid-Open Patent Publication No. 2012-0059361) or a sacrificial layer (see Japanese Patent Publication No. 6411258) as described in the 'Background Art' above, but the present invention can secure the flexibility of CIGS solar cells without such a separation layer or sacrificial layer.

The present invention proposes a technology for implementing a CIGS solar cell by forming a thin film polyimide layer on a carrier substrate, stacking a CIGS solar cell structure on the polyimide layer, and then separating the carrier substrate and the polyimide layer from each other. Here, the CIGS solar cell structure refers to a stack including a rear transparent electrode, a CIGS light-absorbing layer, and a front transparent electrode.

In the case of Korean Laid-Open Patent Publication No. 2012-0059361 and Japanese Patent Publication No. 6411258, a separation layer or a sacrificial layer is essentially required for separating the glass substrate and the CIGS solar cell structure, and a flexible substrate (conductive flexible layer) is stacked through a separate process after the separation of the glass substrate and the CIGS solar cell structure, which makes the process very complicated.

In contrast, the present invention stacks the CIGS solar cell structure on the polyimide layer, and thus, does not require a separate process for stacking the polyimide layer, unlike Korean Laid-Open Patent Publication No. 2012-0059361 and Japanese Patent Publication No. 6411258. In addition, since the present invention adopts a method of separating the carrier substrate and the polyimide layer by irradiating a short-wavelength laser to the interface between the carrier substrate and the polyimide layer, it does not require a separation layer or a sacrificial layer as in Korean Laid-Open Patent Publication No. 2012-0059361 and Japanese Patent Publication No. 6411258.

In addition, since the process of stacking the thin film layers, i.e., the rear transparent electrode, the CIGS light-absorbing layer, and the front transparent electrode, on the polyimide layer is performed in a state in which the polyimide layer is stacked on the carrier substrate, the bending and thermal expansion of the polyimide layer can be suppressed by the carrier substrate to enhance the bonding force between the polyimide layer and the thin film layer, thereby minimizing the cracking and peeling phenomena of the thin film layer stacked on the polyimide layer.

Meanwhile, in the present invention, a light-transmitting region (T) is formed in the CIGS solar cell in order to secure the transparency of the CIGS solar cell. Specifically, by sequentially stacking a rear transparent electrode, a CIGS light-absorbing layer, and a front transparent electrode, and in this stacked state, removing some areas of the CIGS light-absorbing layer and the front transparent electrode, the light-transmitting region (T) is formed, thereby ensuring the transparency of the CIGS solar cell.

Hereinafter, a CIGS solar cell having both transparency and flexibility according to an embodiment of the present invention and a manufacturing method thereof will be described in detail with reference to the drawings.

Referring to FIG. 1, a CIGS solar cell having both transparency and flexibility according to an embodiment of the present invention has a structure in which a rear transparent electrode 120, a CIGS light-absorbing layer 130, and a front transparent electrode 140 are sequentially stacked on a transparent polymer film 110. In addition, a transparent encapsulation layer 150 is provided on the entire surface of the transparent polymer film 110 including the front transparent electrode 140. Here, a buffer layer, not shown in the drawings, is provided between the CIGS light-absorbing layer 130 and the front transparent electrode 140, wherein the buffer layer serves to alleviate a large band gap difference between the CIGS light-absorbing layer 130 and the front transparent electrode 14.

The transparent polymer film 110 is made of a polymer film with excellent light transmittance and flexibility, and the CIGS solar cell structure is stacked on the transparent polymer film 110, thereby ensuring the flexibility of the CIGS solar cell. Here, the CIGS solar cell structure refers to a structure including the rear transparent electrode 120, the CIGS light-absorbing layer 130, and the front transparent electrode 140. In addition, the transparent polymer film 110 must have excellent transmittance for long-wavelength lasers and excellent absorption characteristics for short-wavelength lasers, which will be described in detail in the manufacturing method of the CIGS solar cell described below.

The transparent polymer film 110 is a polymer film with transmittance and flexibility, and its material is not particularly limited. As an example, a film made of polyimide may be used. The polyimide film with excellent high-temperature heat resistance has strong short-wavelength absorption and thus is yellow.

In the CIGS solar cell having the above structure, transparency is secured by the light-transmitting region (T). Specifically, in a structure in which the rear transparent electrode 120, the CIGS light-absorbing layer 130, and the front transparent electrode 140 are sequentially stacked on the transparent polymer film 110, some areas of the CIGS light-absorbing layer 130 and the front transparent electrode 140 are removed, and the area where the CIGS light-absorbing layer 130 and the front transparent electrode 140 are removed corresponds to the light-transmitting region (T).

In the light-transmitting region (T), as the CIGS light-absorbing layer 130 and the front transparent electrode 140 are removed, the rear transparent electrode 120 is exposed. As the rear transparent electrode 120 is exposed, the incident light is transmitted through the rear transparent electrode 120 and the transparent polymer film 110. In this way, as light is transmitted through the light-transmitting region (T), the transparency of the CIGS solar cell can be secured. Here, the area of the light-transmitting region (T) can be selectively adjusted in consideration of the power generation efficiency and light transmitting property of the CIGS solar cell, and the removal area of the CIGS light-absorbing layer 130 and the front transparent electrode 140 is determined accordingly.

In addition, by adjusting the thickness of the transparent polymer film 110, the transmittance of the long-wavelength laser through the transparent polymer film 110 and the color of the transparent polymer film 110 can be controlled. When the light-transmitting region (T) is formed, the long-wavelength laser is irradiated to the lower portion of the transparent polymer film 110 (more precisely, the lower portion of the carrier substrate 10) and the long-wavelength laser is absorbed in the CIGS light-absorbing layer 130. In this case, the long-wavelength laser must transmit not only the carrier substrate 10 but also the transparent polymer film 110 without loss. If the long-wavelength laser for forming the light-transmitting region (T) is absorbed in the transparent polymer film 110, not only is the removal of the CIGS light-absorbing layer 130 for forming the light-transmitting region (T) not completely achieved, but also the polymer film 110 is damaged. Therefore, the transparent polymer film 110 should have high transmittance for the long-wavelength laser, and the transmittance of the long-wavelength laser can be increased by lowering the thickness of the transparent polymer film 110 to a certain level or less. Referring to the experimental example described below, the transmittance of the long-wavelength laser having a wavelength of 500 nm or more can be improved by adjusting the thickness of the polyimide layer to 3 μm or less. In addition, in the case of the transparent polymer film 110 that partially absorbs a blue wavelength, as the thickness decreases, the color changes from a chromatic color to an achromatic color, so that the aesthetics of the transmitted color can be improved.

Meanwhile, the transparent encapsulation layer 150 is stacked on the entire surface of the transparent polymer film 110 including the exposed rear transparent electrode 120 of the light-transmitting region (T). This transparent encapsulation layer 150 serves to protect the light-absorbing layer and the CIGS solar cell structure exposed by the light-transmitting region (T) from the external environment, and further acts as a physical support when separating the carrier substrate 10 and the transparent polymer film 110, thereby preventing the CIGS solar cell structure from being damaged during the separation process of the carrier substrate 10 and the transparent polymer film 110.

The rear transparent electrode 120 may be configured as a single layer of a transparent conductive oxide, or may be configured as a double layer or triple layer structure by combining a transparent conductive oxide and a conductive metal.

When the rear transparent electrode 120 is configured as a double layer or triple layer structure by combining a transparent conductive oxide and a conductive metal, an internal color due to the transmitted light interference color can be implemented by light interference due to a number of interfaces existing inside the rear transparent electrode 120. That is, when light is incident on the light-transmitting region (T), the internal color is expressed by light interference at the interface between the transparent conductive oxide and the conductive metal, and light interference at the interface between the conductive metal and the transparent conductive oxide. Here, the internal color refers to a color visible indoors when the CIGS solar cell of the present invention is applied to a window in the form of a window-type solar cell module.

In configuring the rear transparent electrode 120, the transparent conductive oxide may be any one selected from indium oxide ($In_2O_3$) doped with one or more metals selected from tin (Sn), molybdenum (Mo), tungsten (W), and titanium (Ti); tin oxide ($SnO_2$) doped with fluorine (F) or antimony (Sb); zinc oxide (ZnO) doped with one or more elements selected from elements consisting of aluminum (Al), gallium (Ga), indium (In), boron (B), fluorine (F), and hydrogen (H); a mixed oxide of indium oxide and zinc oxide (IZO); or a mixed oxide of zinc oxide and tin oxide (ZTO).

In addition, as the conductive metal, any one of molybdenum (Mo), silver (Ag), gold (Au), platinum (Pt), aluminum (Al), and copper (Cu) with excellent electrical conductivity may be used, and an alloy of two or more elements may be used to secure interfacial structure flatness and thermal/mechanical/chemical durability. Furthermore, the transparent conductive oxide formed on the transparent polymer film 110 may be replaced with a material having light transmitting property even if the electrical conductivity is low. For example, a metal oxide such as $SiO_2$ or $Al_2O_3$, a nitride such as $SiN_x$ or AlN, and a fluoride such as $MgF_2$ may be stacked on the transparent polymer film 110.

The front transparent electrode 140 is preferably configured as a single layer of a transparent conductive oxide (TCO) to minimize absorption loss of light. The CIGS light-absorbing layer 130 serves to generate electron-hole pairs through photoelectric conversion of the received light, and may be composed of $CuIn_{1-x}Ga_x(Se,S)_2$ as an example, but is not limited thereto.

Meanwhile, when the CIGS solar cell according to the present invention is configured in the form of an integrated module including a plurality of solar cells, scribing regions P1, P2, and P3 for separating the plurality of solar cells and connecting them in series are provided. Specifically, a scribing region P1 for insulation between cells of the rear transparent electrode 120, a scribing region P2 for connection between cells of the rear transparent electrode 120 and the front transparent electrode 140, and a scribing region P3 for insulation between cells of the front transparent electrode 140 is formed, which will be described in detail in the method of manufacturing a CIGS solar cell described later.

The CIGS solar cell having both transparency and flexibility according to one embodiment of the present invention has been described above. Hereinafter, a method of manufacturing the CIGS solar cell having both transparency and flexibility according to one embodiment of the present invention will be described.

Figure 2:
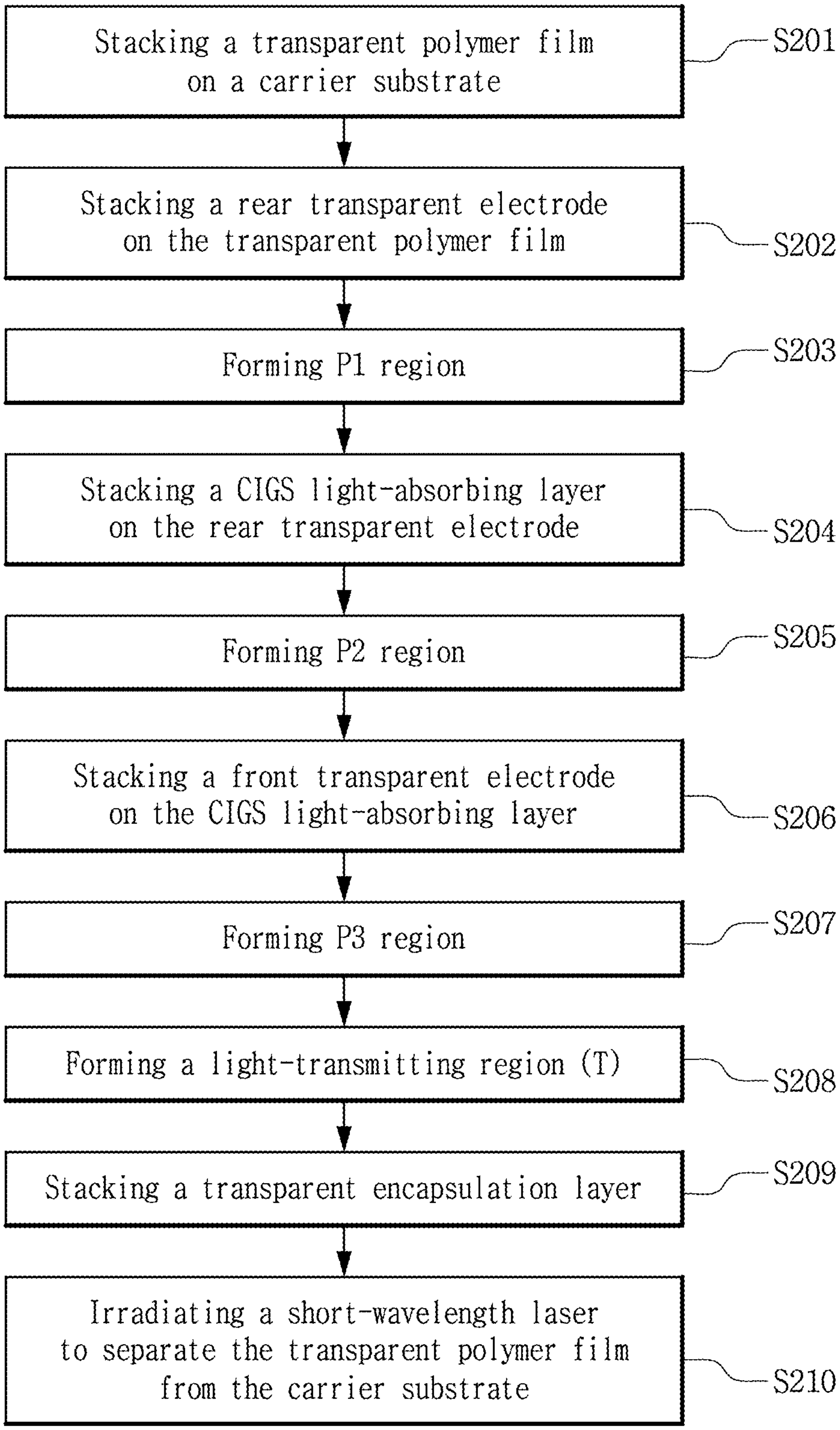
FIG. 2 is a process flow chart illustrating a method for manufacturing a CIGS solar cell having both transparency and flexibility according to one embodiment of the present invention.
Figure 3A:
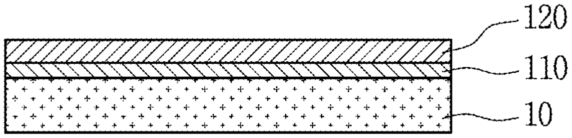
FIGS. 3A to 3I are process cross-sectional views illustrating a method for manufacturing a CIGS solar cell having both transparency and flexibility according to one embodiment of the present invention.
Figure 3B:
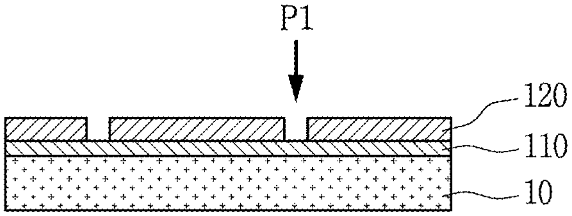

Referring to FIGS. 2 and 3, a transparent polymer film 110 is stacked on a carrier substrate 10 (S201, see FIG. 3A).

The carrier substrate 10 is made of a material having excellent transparency and laser transmittance, and as an example, a glass substrate may be used. For example, any one of sodalime glass, gorilla glass, eagle xg, and quartz glass may be used.

The transparent polymer film 110 is a polymer film having excellent transparency and flexibility, and is made of a material that exhibits high transmittance for long-wavelength lasers and high absorption characteristics for short-wavelength lasers.

When forming a light-transmitting region (T) to be described later, a laser is irradiated from a lower portion of the carrier substrate 10 toward a CIGS light-absorbing layer 130 to heat an interface between a transparent rear electrode 120 and the CIGS light-absorbing layer 130, thereby removing a thin film structure above the CIGS light-absorbing layer. To this end, the laser must be able to pass through the carrier substrate 10 and the transparent polymer film 110 without absorption and must be absorbed in the CIGS light-absorbing layer 130. This can be implemented by applying a long-wavelength laser having high transmittance to the transparent polymer film 110. When the carrier substrate 10 and the transparent polymer film 110 are separated, a short-wavelength laser is irradiated from a lower portion of the carrier substrate 10 toward the transparent polymer film 110, wherein the short-wavelength laser should exhibit high transmittance to the carrier substrate 10 and high absorbance in the transparent polymer film 110. Here, the wavelength of the long-wavelength laser is 500 nm or more, preferably 750 nm or more. In addition, the short-wavelength laser may have a wavelength equal to or less than 380 nm and equal to or greater than a wavelength corresponding to the band gap of the carrier substrate.

The transparent polymer film 110 is formed of a material satisfying these conditions, and as an example, polyimide may be used.

Furthermore, the transmittance of the long-wavelength laser is determined according to the thickness of the transparent polymer film 110. Specifically, as the thickness of the transparent polymer film 110 decreases, the transmittance of the long-wavelength laser increases, and when polyimide is used as the transparent polymer film 110, the transmittance of the long-wavelength laser having a wavelength of 500 nm or more can be improved by adjusting the thickness of the polyimide layer to 3 μm or less. Furthermore, as the thickness of the transparent polymer film 110 decreases, it changes from a chromatic color to an achromatic color, and this characteristic can be used to select the thickness of the transparent polymer film 110.

Various methods may be used to stack the transparent polymer film 110, for example, a method such as spin coating or bar coating may be used, and the thickness of the transparent polymer film 110 can be selectively adjusted through process conditions.

In a state in which the carrier substrate 10 on which the transparent polymer film 110 is stacked is prepared, a rear transparent electrode 120 is stacked on the transparent polymer film 110 (S202, see FIG. 3A).

As described above, the rear transparent electrode 120 may be formed as a single layer of a transparent conductive oxide (TCO), or a double layer or triple layer structure by combining a transparent conductive oxide (TCO) and a conductive metal.

When the rear transparent electrode 120 is formed as a double or triple layer structure by combining the transparent conductive oxide (TCO) and the conductive metal, an internal color is realized by light interference at the interface between the transparent conductive oxide (TCO) and the conductive metal. Through the process described later, the CIGS light-absorbing layer 130 and the front transparent electrode 140 are removed in some areas to form a light-transmitting region (T), and the rear transparent electrode 120 is exposed in the light-transmitting region (T). The light incident on the light-transmitting region (T) is transmitted through the rear transparent electrode 120, and when the rear transparent electrode 120 is formed as a double or triple layer structure of the transparent conductive oxide (TCO) and the conductive metal as described above, the internal color is expressed toward the rear transparent electrode 120 due to light interference at the interface. As an example, when the rear transparent electrode 120 is formed in a form in which the conductive metal is interposed between the two layers of the transparent conductive oxide (TCO), the color expressed by the rear transparent electrode 120 may be adjusted to R, G, B, or the like by adjusting the thickness of each of the transparent conductive oxide (TCO) and the conductive metal.

On the other hand, when the rear transparent electrode 120 is formed as a single layer of the transparent conductive oxide (TCO), a transparent color is achieved.

As the transparent conductive oxide (TCO), any one selected from indium oxide ($In_2O_3$) doped with one or more metals selected from tin (Sn), molybdenum (Mo), tungsten (W), and titanium (Ti); tin oxide ($SnO_2$) doped with fluorine (F) or antimony (Sb); zinc oxide (ZnO) doped with one or more elements selected from elements consisting of aluminum (Al), gallium (Ga), indium (In), boron (B), fluorine (F), and hydrogen (H); a mixed oxide of indium oxide and zinc oxide (IZO); or a mixed oxide of zinc oxide and tin oxide (ZTO) may be used.

In addition, as the conductive metal, any one of silver (Ag), gold (Au), platinum (Pt), aluminum (Al), and copper (Cu) with excellent electrical conductivity may be used, and an alloy of two or more elements may also be used to secure interfacial structure flatness and thermal/mechanical/chemical durability. Here, in the case of the lower transparent conductive oxide layer formed on the transparent polymer film 110, a material having light transmitting property may be alternatively applied even if the electrical conductivity is low. For example, a metal oxide such as $SiO_2$ or $Al_2O_3$, a nitride such as SiNg or AlN, and a fluoride such as $MgF_2$ may be applied as the lower transparent conductive oxide layer.

The transparent conductive oxide (TCO) and the conductive metal may be stacked by physical vapor deposition (PVD) or chemical vapor deposition (CVD). Meanwhile, when a sputtering process is used for stacking the transparent conductive oxide (TCO), the adhesion between the transparent polymer film 110 and the carrier substrate 10 can be increased by increasing the oxygen content of the process gas. When the adhesion between the transparent polymer film 110 and the carrier substrate 10 is improved, the phenomenon of cracking and peeling is suppressed during subsequent thin film deposition, thereby improving the mechanical durability of the CIGS solar cell.

In addition, the transparent polymer film 110 is stacked on the carrier substrate 10, and all thin film layers of the CIGS solar cell are stacked on the transparent polymer film 110 as described below, in order to suppress the bending and thermal expansion characteristics of the transparent polymer film 110 as much as possible. When all thin film layers of the CIGS solar cell such as the CIGS light-absorbing layer 130 are stacked on the transparent polymer film 110 without the carrier substrate 10, the thermal expansion coefficient of the transparent polymer film 110 is greater than that of the CIGS light-absorbing layer 130, causing problems such as peeling and the like. However, when the CIGS light-absorbing layer 130 or the like is stacked on the transparent polymer film 110 while the transparent polymer film 110 is fixed on the carrier substrate 10 as in the present invention, the thermal expansion of the transparent polymer film 110 is suppressed by the carrier substrate 10, thereby minimizing the difference in the thermal expansion coefficient between the transparent polymer film 110 and the CIGS light-absorbing layer 130. Accordingly, the peeling of the thin film layer stacked on the transparent polymer film 110 can be minimized. Furthermore, since the transparent polymer film 110 is maintained to be fixed to the carrier substrate 10, the bending of the transparent polymer film 110 is also suppressed. Here, it is preferable that the carrier substrate 10 is a glass substrate having a thermal expansion coefficient similar to that of the CIGS light-absorbing layer 130 at a temperature of 400 to 500° C., which is the deposition temperature of the CIGS light-absorbing layer 130. For example, sodalime glass, gorilla glass, or the like may be used as the carrier substrate 10.

Figure 3C:
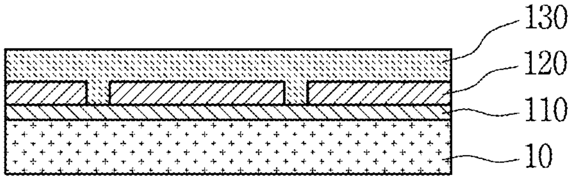

In a state in which the rear transparent electrode 120 is stacked on the transparent polymer film 110, a CIGS light-absorbing layer 130 is stacked on the rear transparent electrode 120 (S204, see FIG. 3C). Meanwhile, when the CIGS solar cell according to the present invention is manufactured in the form of an integrated module, a scribing region P1 for insulation between cells of the rear transparent electrode 120 is formed before the CIGS light-absorbing layer 130 is stacked (S203, see FIG. 3D). Specifically, in a state in which the rear transparent electrode 120 is stacked on the transparent polymer film 110, the rear transparent electrode 120 is scribed in a certain area along a scribing line to divide it into a plurality of cells and to insulate the neighboring cells of the rear transparent electrode 120 from each other. In this case, the scribing line is referred to as a P1 region, the rear transparent electrode 120 is divided into a plurality of cells by the P1 region, and the neighboring cells of the rear transparent electrode 120 are electrically insulated from each other by the P1 region. The scribing process for forming the P1 region and the scribing processes for forming the P2 region and the P3 region, which will be described later, may be performed using a laser. Hereinafter, the description will be made based on the P1, P2, and P3 processes being performed for the manufacture of an integrated module. In the case of a single cell other than an integrated module, the P1, P2, and P3 processes are omitted.

In a state in which the P1 region is formed, the CIGS light-absorbing layer 130 is stacked on the entire surface of the rear transparent electrode 120 (S204, see FIG. 3C). Accordingly, the CIGS light-absorbing layer 130 is stacked on the rear transparent electrode 120, and the CIGS light-absorbing layer 130 is also filled in the P1 region. The CIGS light-absorbing layer 130 serves to generate electron-hole pairs through photoelectric conversion of the received light, and may be composed of $CuIn_{1-x}Ga_x(Se,S)_2$ as an example, but is not limited thereto. The CIGS light-absorbing layer 130 may be deposited using a three-step simultaneous vacuum evaporation method as an example.

Figure 3D:
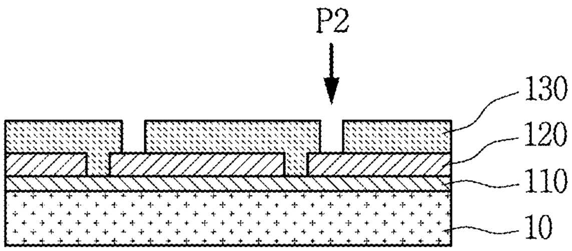
Figure 3E:
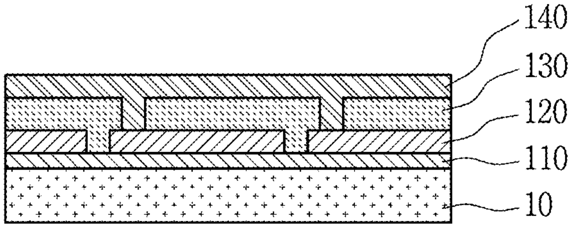

Subsequently, the CIGS light-absorbing layer 130 is scribed along the region P2 to expose the rear transparent electrode 120 (S205, see FIG. 3D). In this state, the front transparent electrode 140 is stacked on the entire surface of the CIGS light-absorbing layer 130 (S206, see FIG. 3E). At this time, while the front transparent electrode 140 is stacked on the CIGS light-absorbing layer 130, the front transparent electrode 140 is also filled in the P2 region. As the front transparent electrode 140 is filled in the P2 region, the front transparent electrode 140 and the rear transparent electrode 120 are electrically connected to each other. The front transparent electrode 140 is preferably formed of a single layer of transparent conductive oxide (TCO) in order to enhance light transmission efficiency. Here, a buffer layer (not shown) may be stacked on the CIGS light-absorbing layer 130 before the formation of the P2 region.

Figure 3F:
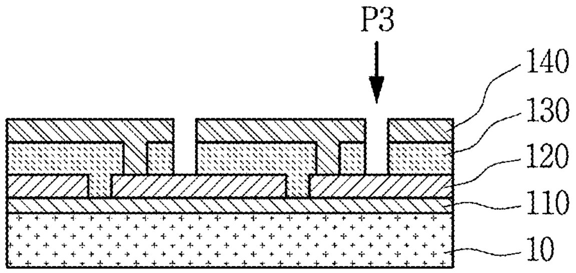

In a state in which the front transparent electrode 140 is stacked, the front transparent electrode 140 and the light-absorbing layer are scribed along the P3 region to insulate the neighboring cells of the front transparent electrode 140 from each other (S207, see FIG. 3F). Through the above process, the manufacturing process for the integrated module including a plurality of cells is completed.

In a state in which the above process is completed, a process for securing transparency and flexibility of the CIGS solar cell is performed. First, a process of forming a light-transmitting region (T) for securing transparency is performed.

Figure 3G:
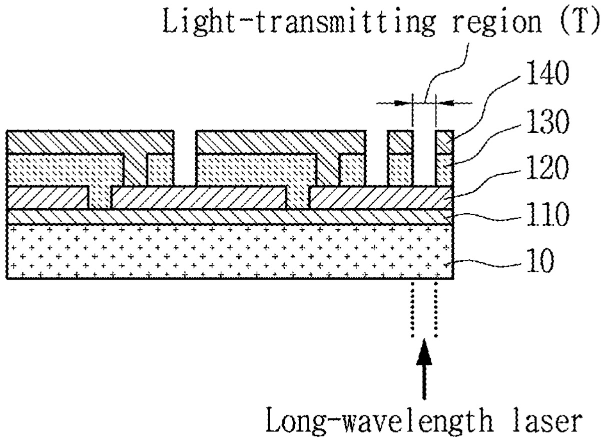

In a state in which the stacking of the front transparent electrode 140 is completed, the CIGS light-absorbing layer 130 and the front transparent electrode 140 in areas defined as the light-transmitting region (T) are removed to expose the rear transparent electrode 120, thereby forming the light-transmitting region (T) (S208, see FIG. 3G).

When forming the light-transmitting region (T), a long-wavelength laser is irradiated from a lower portion of the carrier substrate 10 toward the CIGS light-absorbing layer 130, and the CIGS light-absorbing layer 130 absorbs the long-wavelength laser to be heated. The long-wavelength laser is irradiated to the interface between the rear transparent electrode 120 and the CIGS light-absorbing layer 130 to heat the CIGS light-absorbing layer 130, causing the CIGS light-absorbing layer 130 to be melted to form gas, and then the interface between the rear transparent electrode 120 and the CIGS light-absorbing layer 130 is separated by the expansion of the gas.

According to this principle, the CIGS light-absorbing layer 130 and the front transparent electrode 140 thereon are separated and removed. In this case, it is necessary to find a wavelength that allows the long-wavelength laser to penetrate the transparent polymer film 110 while being absorbed in the CIGS light-absorbing layer 130. Specifically, the wavelength of the long-wavelength laser should be 500 nm or more for high transmittance to the transparent polymer film 110, and should be smaller than 1200 nm, that is, a wavelength corresponding to the band gap (1.0~1.7 eV) of the CIGS light-absorbing layer 130, for absorption in the CIGS light-absorbing layer 130. Considering that the light-absorbing capacity of the CIGS light-absorbing layer 130 exhibits excellent characteristics in the bandgap of 1.0 to 1.2 eV, it is preferable that the wavelength of the long-wavelength laser be less than 1000 nm.

Figure 3H:
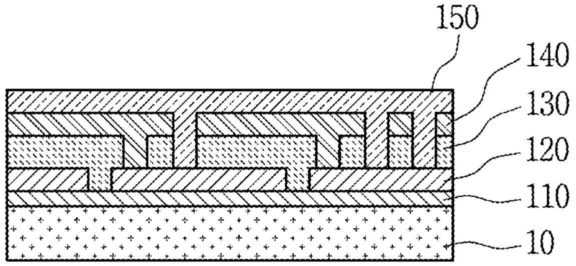
Figure 3I:
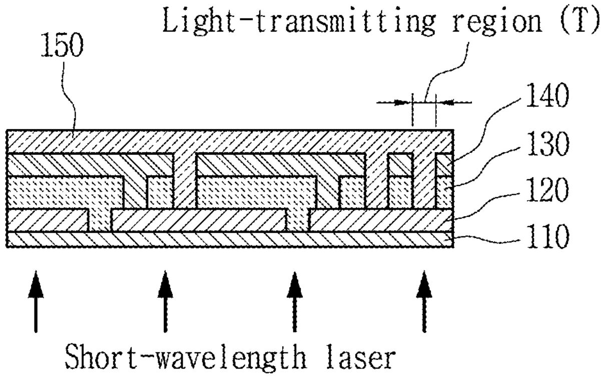
Figure 4:
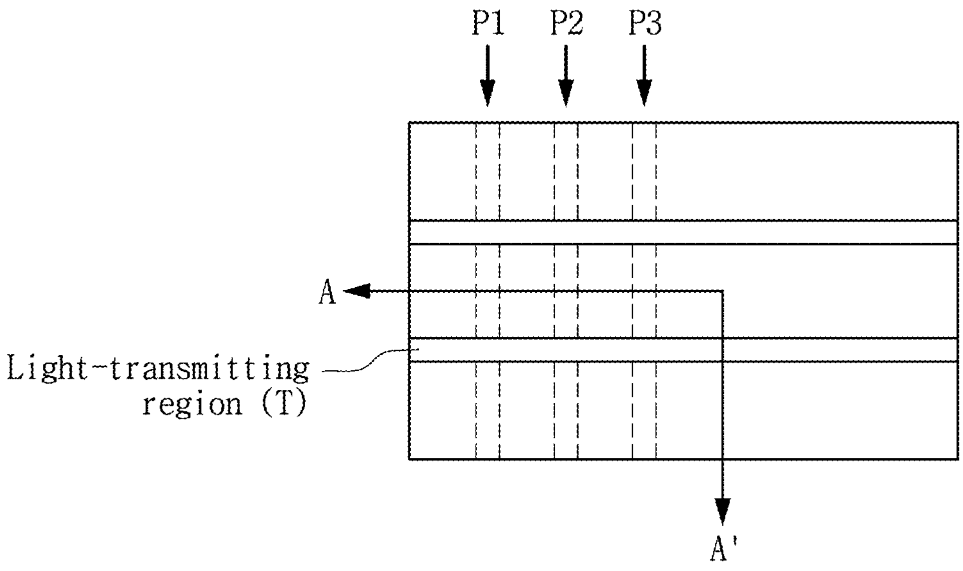
FIG. 4 is a plan view of a CIGS solar cell having both transparency and flexibility according to one embodiment of the present invention.
Figure 5A:
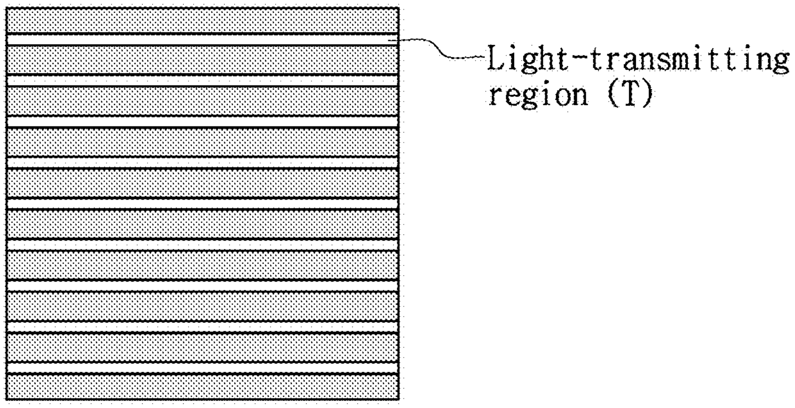
FIGS. 5A and 5B are reference views showing embodiments of a light-transmitting region (T).
Figure 5B:
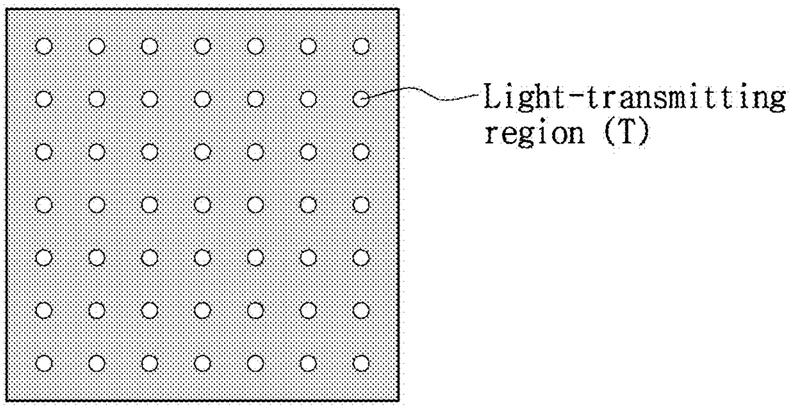

Meanwhile, the light-transmitting region (T) may be linear as shown in FIG. 5A or dot-shaped as shown in FIG. 5B, and in the case of being linear, may be formed in a shape orthogonal to the P1, P2, and P3 regions as shown in FIG. 4. For reference, FIGS. 1 and 3 correspond to a cross section taken along line A-A' of FIG. 4.

In a state in which the light-transmitting region (T) is formed, a process of separating the carrier substrate 10 and the transparent polymer film 110 is performed to secure the flexibility of the CIGS solar cell.

First, a transparent encapsulation layer 150 is stacked on the entire surface including the light-transmitting region (T) (S209, see FIG. 3H). The transparent encapsulation layer 150 serves to protect the CIGS solar cell including the light-absorbing layer exposed by the light-transmitting region (T) from the external environment, and further acts as a support for preventing the CIGS solar cell from being physically damaged during the separation process of the carrier substrate 10 and the transparent polymer film 110 described later.

In a state where the transparent encapsulation layer 150 is formed, a short-wavelength laser is irradiated from a lower portion of the carrier substrate 10 toward the transparent polymer film 110, so that it is transmitted through the carrier substrate 10 and absorbed in the transparent polymer film 110. That is, the short-wavelength laser is irradiated to the interface between the carrier substrate 10 and the transparent polymer film 110, and the transparent polymer film 110 that has absorbed the short-wavelength laser is heated and separated from the carrier substrate 10 (S210, see FIG. 3I).

As the carrier substrate 10 is separated, a shape is formed in which a stack of the rear transparent electrode 120, the CIGS light-absorbing layer 130, and the front transparent electrode 140 having the light-transmitting region (T) formed therein is provided on the transparent polymer film 110, thereby completing the manufacture of the CIGS solar cell having both transparency and flexibility.

It is preferable that the short-wavelength laser for separating the carrier substrate 10 and the transparent polymer film 110 has a wavelength of 380 nm or less for transmission through the carrier substrate 10 and absorption in the transparent polymer film 110. Since there should be no absorption in the carrier substrate, the wavelength should be larger than a wavelength corresponding to the band gap of the carrier substrate. As an example, a picosecond laser having a wavelength of 380 nm or less and having almost no thermal diffusion characteristics may be used as the short-wavelength laser. Further, when separating the carrier substrate 10 and the transparent polymer film 110, it is preferable to irradiate the short-wavelength laser over the entire area of the carrier substrate 10.

Hereinbefore, the CIGS solar cell having both transparency and flexibility according to one embodiment of the present invention and the method of manufacturing the same have been described. Hereinafter, the present invention will be described in more detail through experimental examples.

Experimental Example 1: Characteristics of Light Transmittance (T), Reflectance (R), and Light Absorbance (A) of Each Glass Substrate In order to select a glass substrate to be used as a carrier substrate, the light transmittance (T), reflectance (R), and light absorbance (A) characteristics were analyzed for various types of glass substrates (sodalime glass, gorilla glass, eagle xg, and quartz glass).

Figure 6A:
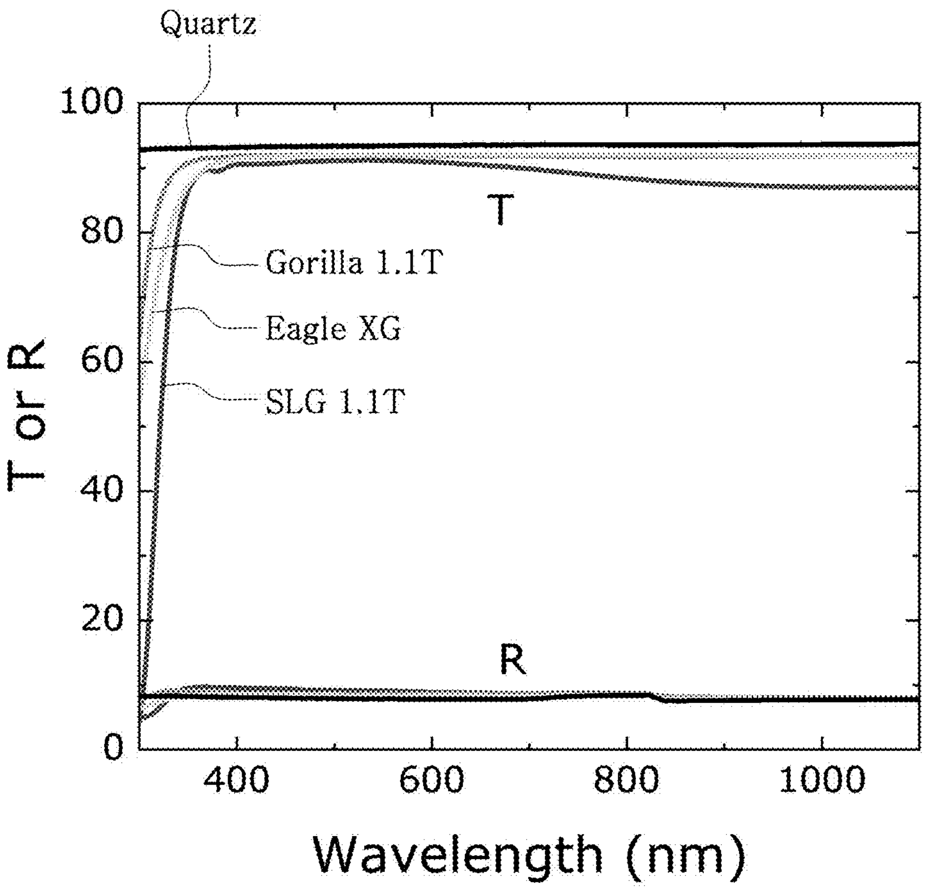
FIG. 6A shows the light transmittance (T) and reflectance (R) of each of sodalime glass (SLG), gorilla glass, eagle xg, and quartz glass.
Figure 6B:
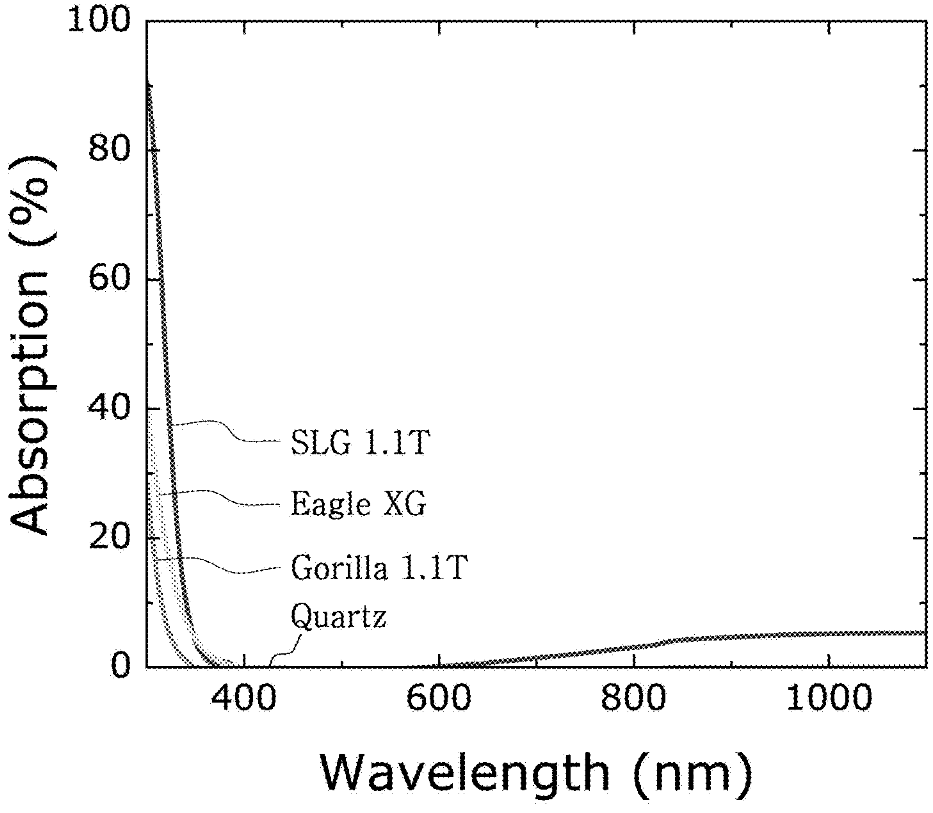
FIG. 6B shows the results of calculating the light absorbance (A) using the results of FIG. 6A.

FIG. 6A shows the light transmittance (T) and reflectance (R) of each of sodalime glass, gorilla glass, eagle xg, and quartz glass, and FIG. 6B shows the results of calculating the light absorbance (A) from the relationship of $A=100-(T+R)$ using the results of FIG. 6A. Meanwhile, glass substrates having a thermal expansion coefficient relatively close to that of the CIGS light-absorbing layer in the deposition temperature range of the CIGS light-absorbing layer (400-500° C.) are sodalime glass (SLG) and gorilla glass. The band gaps of SLG and gorilla glass are 3.65 eV and 3.96 eV, respectively, and the light absorption of SLG and gorilla glass increases significantly at wavelengths of 340 nm or less and 310 nm or less, respectively. Therefore, when applying a short-wavelength laser shorter than the above wavelength, the possibility of damage to the glass substrate due to laser absorption of the substrate should be considered.

Experimental Example 2: Optical Characteristics According to the Thickness of Polyimide (P1)

A polyimide (P1) film was coated on a sodalime glass substrate (SLG) by spin coating, and the optical characteristics according to the polyimide (P1) thickness were examined.

After cleaning the sodalime glass substrate (SLG) with a UV ozone cleaner, a polyamic acid solution was coated on the sodalime glass substrate (SLG) using a spin coater. In this case, the rotation speed was maintained at 800 rpm for 30 seconds, then increased to 2000 rpm and maintained for 40 seconds. For comparison, a separate experiment was conducted in which the rotation speed was maintained at 800 rpm for 30 seconds, then increased to 6000 rpm and maintained for 40 seconds. Next, the sample coated with the polyamic acid solution was placed on a hot plate, heated to 90° C., and maintained for 5 minutes. Then, the sample was placed in an oven under a nitrogen atmosphere and maintained at 450° C. for 1 hour. During this process, the molecular structure of the polyamic acid is dehydrated while being imidized (see Scheme 1 below).

[Scheme 1]

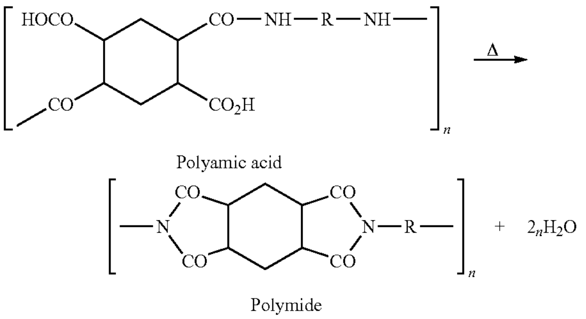

Polyamic acid

Polymide

As a result of the experiment, a polyimide (P1) film having a thickness of 6.7 μm was coated when the rotation speed of 2000 rpm was applied, and a polyimide (P1) film having a thickness of 2.5 μm was coated when the rotation speed of 6000 rpm was applied.

Figure 7A:
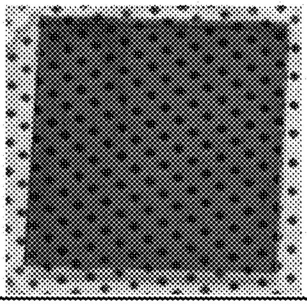
FIG. 7A shows images of SLG/polyimide according to the thickness of polyimide spin-coated on sodalime glass.
Figure 7A:
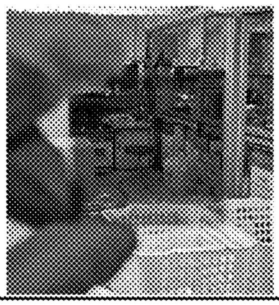
Figure 7A:
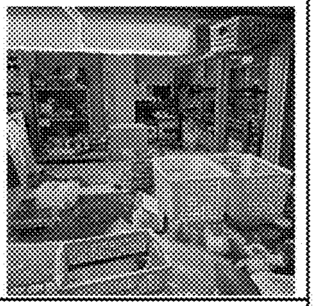
Figure 7A:
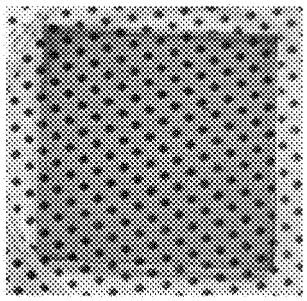
Figure 7A:
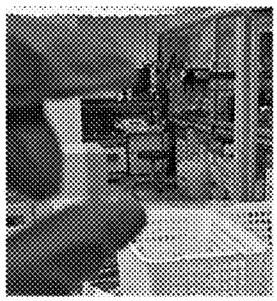
Figure 7A:
Figure 7B:
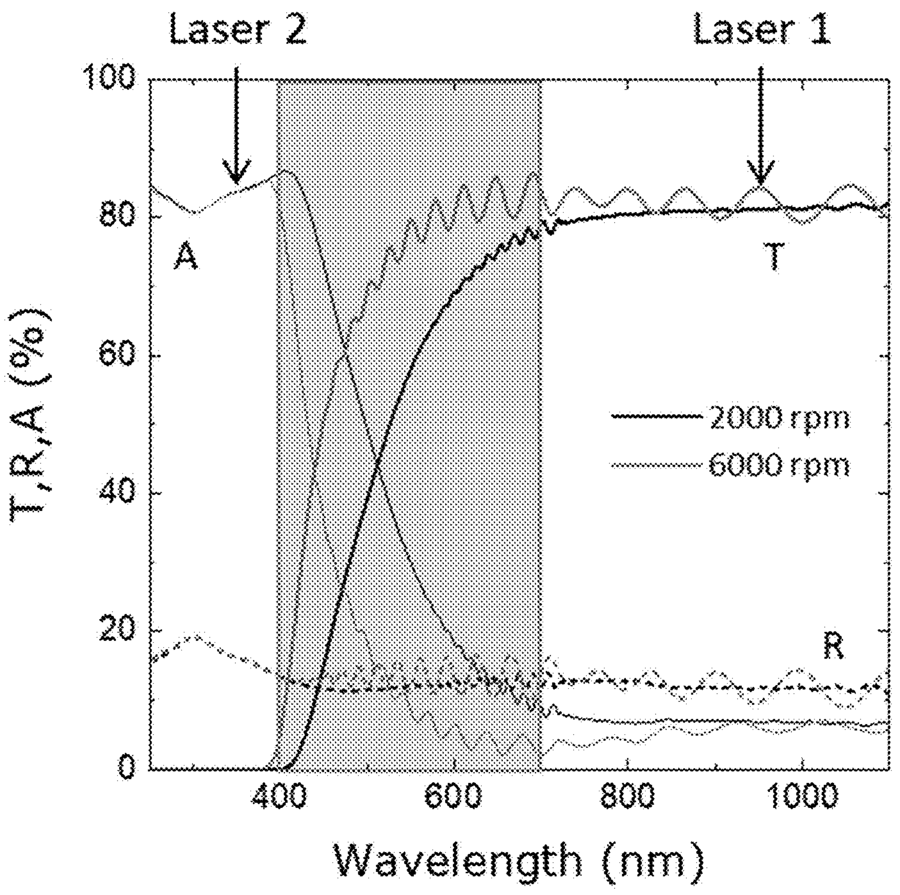
FIG. 7B is an experimental result showing the light transmittance (T), light reflectance (R), and light absorbance (A) of the SLG/polyimide according to the polyimide thickness.

Referring to FIG. 7A, which shows photographs of the polyimide samples (SLG/P1) coated with different thicknesses, it can be seen that when the polyimide (P1) thickness is 6.7 μm, it is yellow, but when the polyimide (P1) thickness is 2.5 μm, the yellow color is diluted. In addition, referring to the results of the optical characteristics of FIG. 7B, in which the light transmittance (T), light reflectance (R), and light absorbance (A) of the SLG/polyimide are measured, it can be confirmed that when the polyimide (P1) thickness is 2.5 μm, the light absorption in the short wavelength band (400-600 nm) is significantly reduced compared to the case where the polyimide (P1) thickness is 6.7 μm.

Experimental Example 3: Manufacturing and Photovoltaic Performance of CIGS Solar Cell An indium tin oxide (ITO) thin film having a thickness of 600 nm was deposited on the SLG/P1 (2.5 μm) prepared according to Experimental Example 2 through DC sputtering. Then, a Mo thin film with a thickness of 1 nm or less was deposited on the ITO thin film. As a comparative example, Mo, which is used as a rear electrode of a conventional CIGS solar cell, was deposited on the SLG, and the subsequent process was applied in the same manner. After the deposition of the rear electrode (ITO and Mo), an Ag thin film having a thickness of 10 nm was deposited on the rear electrode. Then, a CIGS light-absorbing layer was deposited on the Ag thin film through a three-step simultaneous vacuum evaporation method. During the deposition of the CIGS light-absorbing layer, the deposition temperature was 450° C., and the band gap distribution of the CIGS light-absorbing layer was controlled by differently adjusting a relative ratio of In and Ga flux over time. Then, a CdS buffer layer was deposited through a chemical bath deposition method, and i-ZnO and IZO (Indium Zinc Oxide) were sequentially deposited as a front electrode on the CdS buffer layer through sputtering. Then, a metal grid electrode was formed on the IZO. Finally, a 355 nm picosecond laser was irradiated to the SLG/P1 interface to separate the SLG and the P1. In the case of the comparative example, the separation of SLG/P1 is not required.

Figure 8A:
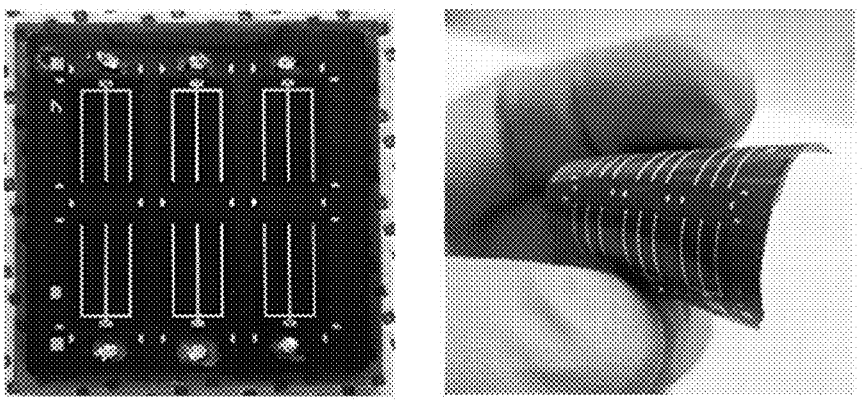
FIG. 8A is a photograph of a CIGS solar cell manufactured by Experimental Example 3.

FIG. 8A is a photograph of the CIGS solar cell manufactured by Experimental Example 3, wherein the left picture is a planar photograph of the state of the CIGS solar cell manufactured on the SLG/P1 substrate, and the right picture is a photograph of a state in which the P1/ITO/CIGS/CdS/iZnO/IZO structure is detached from the SLG and made flexible. As shown in FIG. 8A, the CIGS solar cell with secured flexibility can be confirmed.

Figure 8B:
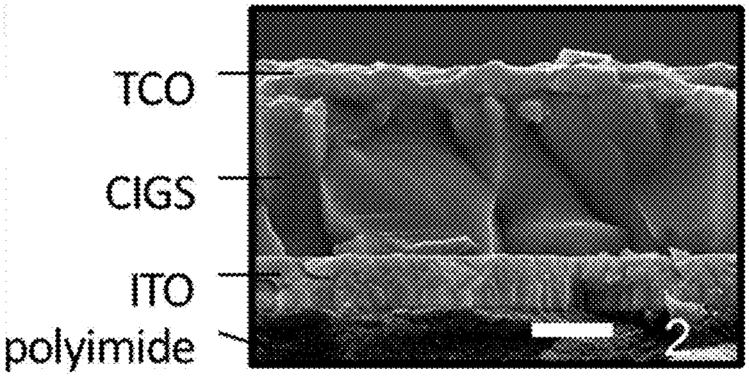
FIG. 8B shows an SEM image of a cross-section of the CIGS solar cell manufactured by Experimental Example 3.

In addition, FIG. 8B shows an SEM image of the cross-section of the CIGS solar cell manufactured by Experimental Example 3, and it can be confirmed that the CIGS solar cell thin film layers (ITO, CIGS, CdS, I—ZnO, IZO) are stably stacked on the polyimide (P1) film.

Figure 8C:
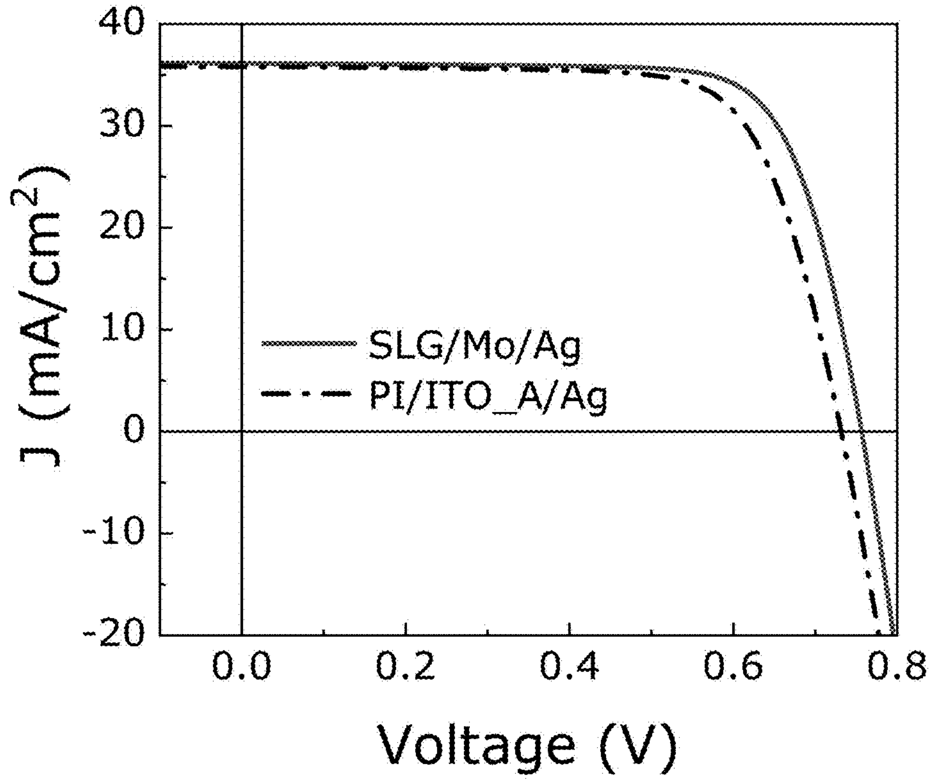
FIG. 8C is an experimental result showing the photovoltaic performance of the CIGS solar cell manufactured by Experimental Example 3 and a CIGS solar cell according to a comparative example.

FIG. 8C and Table 1 below are experimental results showing the photovoltaic performance of the CIGS solar cell manufactured by Experimental Example 3 and the CIGS solar cell according to the comparative example. The CIGS solar cell according to the comparative example corresponds to a general standard CIGS solar cell structure to which a Mo rear electrode is applied.

Referring to FIG. 8C and Table 1, it was confirmed that although the photovoltaic efficiency of the CIGS solar cell (P1/ITO) manufactured by Experimental Example 3 is partially reduced compared to the comparative example (SLG/Mo), the high photovoltaic efficiency of the CIGS solar cell can be realized even with the P1/ITO structure, similar to the P1/Mo structure.

TABLE 1

<Photovoltaic performance of the CIGS solar cells manufactured by the comparative example and Experimental Example 3>

| sub. | Efficiency (%] | $V_{OC}$ (V] | $J_{SC}$ (mA/cm$^2$] | FF (%) |
|---|---|---|---|---|
| SLG/Mo | 20.58 | 0.757 | 36.16 | 75.18 |
| PI/ITO | 19.09 | 0.732 | 35.81 | 72.84 |

Experimental Example 4: Manufacturing and Photovoltaic Performance of CIGS Solar Cell Integrated Module In the process of manufacturing the CIGS solar cell by Experimental Example 3, a process of forming P1, P2, and P3 regions was added to manufacture an integrated module-type CIGS solar cell. In addition, a 355 nm picosecond laser was finally irradiated to the SLG/P1 interface to separate the SLG and the P1. The P1 region is a scribing region for insulation between cells of the rear transparent electrode, the P2 region is a scribing region for connection between cells of the rear transparent electrode and the front transparent electrode, and the P3 region is a scribing region for insulation between cells of the front transparent electrode. When forming the P1, P2, and P3 regions, a 532 nm picosecond laser was incident on the thin film surface and irradiated.

Figure 9A:
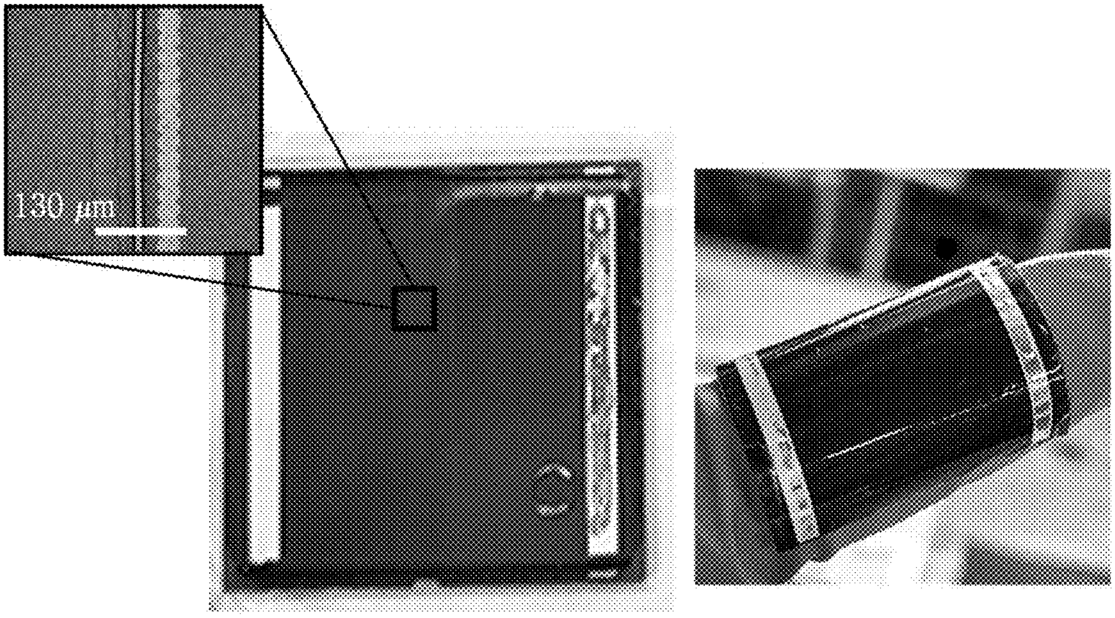
FIG. 9A is a photograph of a CIGS solar cell in the form of an integrated module manufactured by Experimental Example 4.

FIG. 9A is a photograph of a single integrated module-type CIGS solar cell manufactured by Experimental Example 4, and it can be confirmed that the CIGS solar cell has secured flexibility.

Figure 9B:
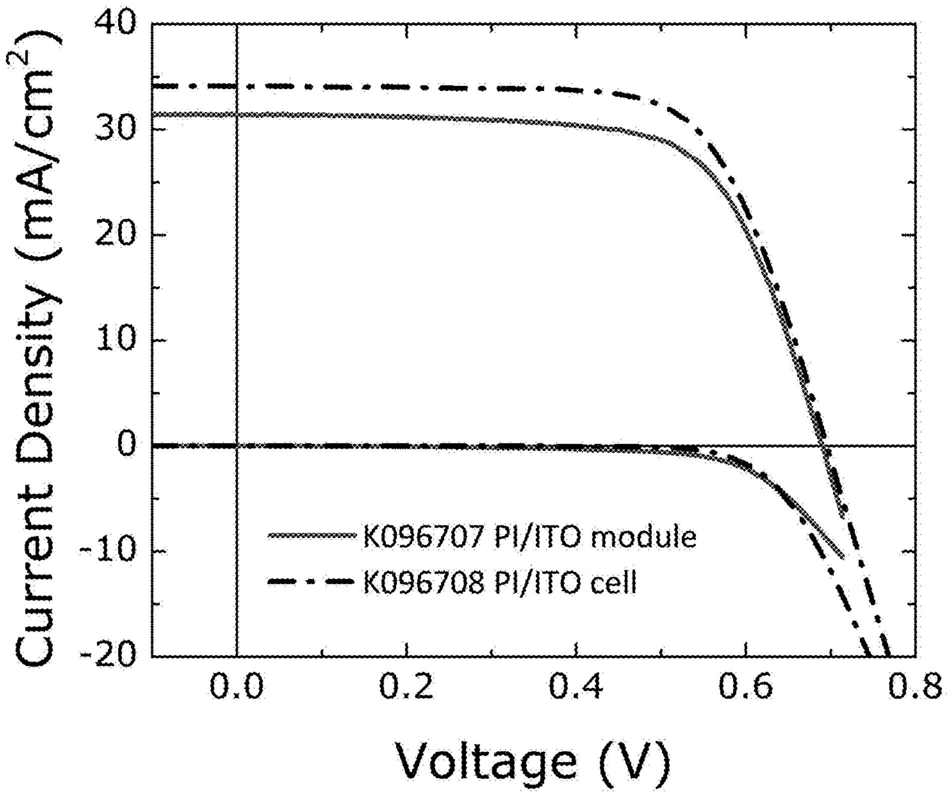
FIG. 9B is an experimental result showing the photovoltaic performance of each of a CIGS solar cell in the form of a cell manufactured by Experimental Example 3 and a CIGS solar cell in the form of an integrated module manufactured by Experimental Example 4.

In addition, referring to the photovoltaic performance of each of the cell-type CIGS solar cell manufactured by Experimental Example 3 and the integrated module-type CIGS solar cell manufactured by Experimental Example 4 (see FIG. 9B and Table 2), the efficiency of the integrated module inevitably experiences a decrease in performance (cell-to-module loss, CTM) due to the structural difference compared to the efficiency of the cell. However, referring to FIG. 9B and Table 2, the CTM loss was very small, about 10%. These results indicate that excellent module can be manufactured through the method of manufacturing a single integrated module-type CIGS solar cell according to the present invention.

TABLE 2

| | | Efficiency (%] | $V_{OC}$ (V] | $J_{SC}$ (mA/cm$^2$] | FF (%) |
|---|---|---|---|---|---|
| PI/ITO | 3 × 3 cell(K0967) | 16.37 | 0.695 | 34.08 | 69.12 |
| | 3 × 3 module(K0967) | 14.70 | 0.690 | 31.43 | 67.80 |

What is claimed is:

1. A method of manufacturing a CIGS solar cell having both transparency and flexibility, the method characterized by including the steps of:

preparing a carrier substrate on which a transparent polymer film is stacked, wherein a thickness of the transparent polymer film is 3 μm or less;

sequentially stacking a rear transparent electrode, a CIGS light-absorbing layer, and a front transparent electrode on the transparent polymer film;

irradiating a long-wavelength laser to an interface between the rear transparent electrode and the CIGS light-absorbing layer in selected areas to remove the CIGS light-absorbing layer and the front transparent electrode, thereby forming a light-transmitting region (T) exposing the rear transparent electrode; and irradiating a short-wavelength laser to an interface between the carrier substrate and the transparent polymer film to separate the carrier substrate and the transparent polymer film from each other.

2. The method of manufacturing a CIGS solar cell having both transparency and flexibility according to claim 1, wherein the short-wavelength laser is transmitted through the carrier substrate and absorbed by the transparent polymer film.

3. The method of manufacturing a CIGS solar cell having both transparency and flexibility according to claim 1, wherein the long-wavelength laser is transmitted through the carrier substrate, the transparent polymer film, and the rear transparent electrode and absorbed by the CIGS light-absorbing layer.

4. The method of manufacturing a CIGS solar cell having both transparency and flexibility according to claim 1, wherein the transparent polymer film is transparent and flexible.

5. The method of manufacturing a CIGS solar cell having both transparency and flexibility according to claim 1, wherein the transparent polymer film comprises polyimide.

6. The method of manufacturing a CIGS solar cell having both transparency and flexibility according to claim 1, wherein the carrier substrate comprises glass.

7. The method of manufacturing a CIGS solar cell having both transparency and flexibility according to claim 1, wherein a wavelength of the long-wavelength laser is 500 nm or greater, and wherein a wavelength of the short-wavelength laser is greater than or equal to a wavelength corresponding to a bandgap of the carrier substrate and equal to or less than 380 nm.

8. The method of manufacturing a CIGS solar cell having both transparency and flexibility according to claim 1, wherein the rear transparent electrode comprises a single layer of a transparent conductive oxide (TCO).

9. The method of manufacturing a CIGS solar cell having both transparency and flexibility according to claim 1, wherein the rear transparent electrode has a double-layer structure including a transparent conductive oxide (TCO) layer and a conductive metal layer sequentially stacked.

10. The method of manufacturing a CIGS solar cell having both transparency and flexibility according to claim 9, wherein the transparent conductive oxide (TCO) is selected from indium oxide ($In_2O_3$) doped with one or more metals selected from tin (Sn), molybdenum (Mo), tungsten (W), and titanium (Ti); tin oxide ($SnO_2$) doped with fluorine (F) or antimony (Sb); zinc oxide (ZnO) doped with one or more elements selected from aluminum (Al), gallium (Ga), indium (In), boron (B), fluorine (F), and hydrogen (H); indium zinc oxide (IZO); and zinc tin oxide (ZTO), and wherein the conductive metal is selected from molybdenum (Mo), silver (Ag), gold (Au), platinum (Pt), aluminum (Al), and copper (Cu), and alloys thereof.

11. The method of manufacturing a CIGS solar cell having both transparency and flexibility according to claim 1, further comprising stacking a transparent encapsulation layer on an entire surface of the transparent polymer film including the light-transmitting region (T) after formation of the light-transmitting region (T) and before separating the carrier substrate from the transparent polymer film.

* * * * *